(12) United States Patent
Nagahara et al.

(10) Patent No.: US 6,538,363 B2
(45) Date of Patent: Mar. 25, 2003

(54) METHOD OF MANUFACTURING A PIEZOELECTRIC ELEMENT

(75) Inventors: Hidetomo Nagahara, Sagamihara (JP); Toshiharu Sato, Kawasaki (JP); Akihisa Adachi, Ikoma (JP); Kiyohide Amemiya, Fujisawa (JP); Kazuhide Shioya, Hirakata (JP); Emiko Igaki, Amagasaki (JP); Masakazu Tanahashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/964,362

(22) Filed: Sep. 28, 2001

(65) Prior Publication Data

US 2002/0036447 A1 Mar. 28, 2002

(30) Foreign Application Priority Data

Sep. 28, 2000 (JP) ........................ 2000-296293

(51) Int. Cl.$^7$ .............................................. H01L 41/08
(52) U.S. Cl. ...................... 310/334; 29/25.35
(58) Field of Search ................ 310/334, 322; 29/25.35

(56) References Cited

U.S. PATENT DOCUMENTS

| | | | | |
|---|---|---|---|---|
| 4,564,980 A | * | 1/1986 | Diepers | 156/264 |
| 4,890,268 A | * | 12/1989 | Smith et al. | 310/334 |
| 5,121,329 A | * | 6/1992 | Crump | 364/468 |
| 5,359,760 A | * | 11/1994 | Busse et al. | 29/25.35 |
| 5,539,965 A | * | 7/1996 | Safari et al. | 29/25.35 |
| 5,744,898 A | * | 4/1998 | Smith et al. | 310/334 |
| 5,818,149 A | * | 10/1998 | Safari et al. | 310/358 |
| 6,278,224 B1 | * | 8/2001 | Sawada et al. | 310/334 |
| 6,301,761 B1 | * | 10/2001 | Brenner et al. | 29/25.35 |

FOREIGN PATENT DOCUMENTS

JP    10-51041    2/1998    ........ H01L/41/08

* cited by examiner

Primary Examiner—Thomas M. Dougherty
(74) Attorney, Agent, or Firm—McDermott, Will & Emery

(57) ABSTRACT

A piezoelectric composite is formed from a piezoelectric precursor prepared by mixing a powder containing piezoelectric material with a binder material and a gap forming material filling a gap formed to the piezoelectric precursor. The gap forming material is then removed from the thus formed piezoelectric composite, thereby forming a piezoelectric element.

9 Claims, 11 Drawing Sheets

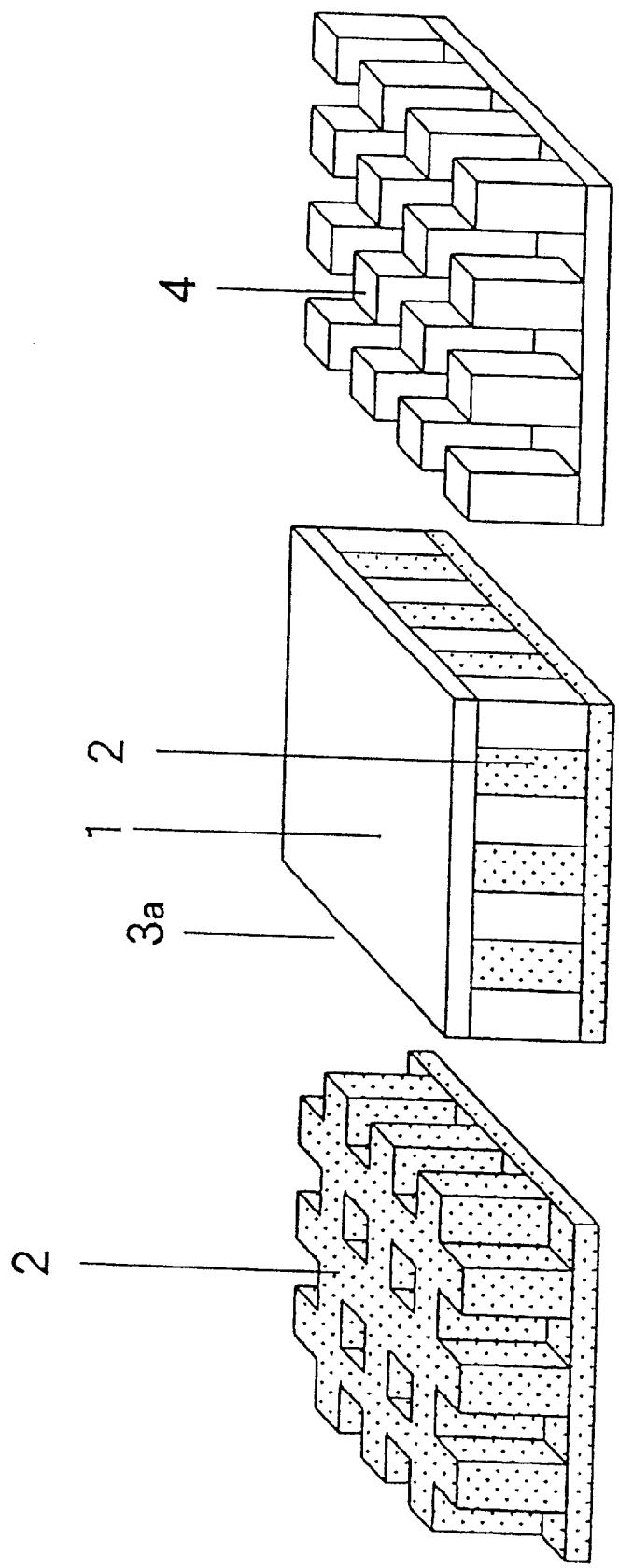

METHOD OF MANUFACTURING A PIEZOELECTRIC ELEMENT

BACKGROUND OF THE INVENTION

The present invention relates to a piezoelectric element and a method of manufacturing the same.

In prior art, there are known piezoelectric elements or materials having various structures, which are utilized as electric acoustic transforming element such as ultrasonic probe, such as shown in FIG. 11, in which FIG. 11A represents a piezoelectric element utilized for a one-dimensional array-type ultrasonic probe, FIG. 11B represents a piezoelectric element utilized for a two-dimensional array-type ultrasonic probe and FIG. 11C represents a piezoelectric composite material.

With reference to FIG. 11, reference numeral 101, 102 and 103 denote piezoelectric ceramic, filler and substrate, respectively, and each of the structures has an arrangement in which a number of fine plate-shaped or column-shaped piezoelectric ceramics are arranged and a filler of such as resin fills gap portions between the piezoelectric ceramics mentioned above such as shown in FIG. 11C. Further, it is to be noted that the term "piezoelectric ceramic" used herein will mean inclusively piezoelectric ceramic layer or column.

For the array-type ultrasonic probes utilizing the piezoelectric elements such as shown in FIGS. 11A and 11B, it is necessary to transmit or receive ultrasonic waves from or to the individual piezoelectric ceramic, respectively, the divided piezoelectric ceramics are connected to drive circuits, respectively, through lead wires, not shown. On the other hand, in the composite piezoelectric material shown in FIG. 11C, electrodes are formed to both upper and lower surfaces, though not shown.

As mentioned above, in the general piezoelectric elements each having a structure in which a number of fine piezoelectric ceramics are arranged, which is manufactured by, for example, methods or processes described hereunder.

(1) One-dimensional Array-type Piezoelectric Element Such as Shown in FIG. 11A

First, there is prepared a flat plate of piezoelectric ceramic having a thickness coincident with a service (working) frequency of an ultrasonic probe (usually, a thickness of about ½ of a using ultrasonic wavelength), and the thus prepared piezoelectric ceramic flat plate is joined onto a substrate 103 or like. Then, the piezoelectric ceramic flat plate is cut one-dimensionally along one direction as shown in FIG. 11A by using a dicing saw so as to provide a preliminarily designed width. According to these processes, the one-dimensional array-type piezoelectric element shown in FIG. 11A, in which a number of piezoelectric ceramics are arranged, is manufactured.

(2) Two-dimensional Array-type Piezoelectric Element Such as Shown in FIG. 11B

The one-directional array-type piezoelectric element shown in FIG. 1A is cut by using a cutting machine such as dicing saw in a direction perpendicular to the preliminarily cut direction with a predetermined design width. That is, the piezoelectric ceramics 101 are cut so as to provide two-dimensional structure shown in FIG. 11B including a number of piezoelectric ceramic columns.

As mentioned above, in the prior art, one- or two-dimensional array-type ultrasonic probe could be manufactured by utilizing the piezoelectric elements or structures such as shown in FIG. 11A or 11B.

Furthermore, it was possible to manufacture a composite piezoelectric material such as shown in FIG. 11C by filling a filler 2 in grooves or gaps formed by cutting the piezoelectric ceramic columns of FIG. 11B.

In the prior art method of manufacturing the piezoelectric elements to be utilized for the ultrasonic probe such as mentioned above, however, fine or minute machine working by using such as a dicing machine was performed to a brittle piezoelectric ceramic, and accordingly, the piezoelectric ceramic was easily damaged or cracked, thus deteriorating the piezoelectric characteristics, or in the case of the array-type piezoelectric elements, the piezoelectric characteristics are not made uniform to the respective piezoelectric elements, and in the case of forming the composite piezoelectric material, the piezoelectric characteristics are locally deteriorated or made not uniform, thus providing a problem.

Moreover, in the prior art, also in a case where, according to requirement of viewpoints of acoustic matters or energy conversion efficiency, it becomes necessary to prepare a piezoelectric element having a structure of extremely narrow dimension between the respective piezoelectric ceramics and/or having a high aspect ratio, it was difficult to manufacture the piezoelectric element satisfying such structure or requirement. Furthermore, it was also very difficult to form a piezoelectric element or structure having a complicated shape such as having a curved surface.

Still furthermore, it is also difficult to effect fine or complicated working to the piezoelectric ceramic, and hence, the working is not so easily done, so that high yielding was not obtainable, also providing a problem. Particularly, in the case of manufacturing the piezoelectric element or material having grooved structure such as shown in FIG. 11B or 11C, it is necessary for the piezoelectric ceramic to be subjected to a number of workings or processes, so that it requires much working time and a problem of abrasion of a working jig such as dicing saw was raised.

SUMMARY OF THE INVENTION

An object of the present invention is to substantially eliminate defects or drawbacks encountered in the prior art mentioned above and to provide a piezoelectric element composed of fine piezoelectric ceramics having uniform and high characteristic particularly such as piezoelectric element arranged with piezoelectric ceramics having high aspect ratio or piezoelectric element having a curved surface which was difficult to be manufactured by a conventional machine working.

Another object of the present invention is to provide a method of manufacturing a piezoelectric element of the characters mentioned above with high yielding.

These and other objects can be achieved according to the present invention by providing, in one aspect, a piezoelectric element characterized in that a composite is formed from a piezoelectric precursor prepared by mixing a powder containing piezoelectric material with a binder material and a gap forming material filling a gap formed to the piezoelectric precursor and the gap forming material is then removed from the composite.

In preferred embodiments of the piezoelectric element of this aspect, the gap formed by removing the gap forming material is filled up with a filler.

The composite has sectional areas continuous at least in one direction so as to provide a same pattern.

The composite is formed by the piezoelectric precursor and the gap forming material in shape of sheets or plates, which are laminated in a predetermined order.

The composite is formed as a composite roll.

The composite is formed by laminating a plurality of composite plate members, in a thickness direction thereof, in which the piezoelectric precursor and the gap forming material are arranged at least in one direction perpendicular to the thickness direction thereof.

The composite is formed by laminating a plurality of composite plate members, in a thickness direction thereof, in which the piezoelectric precursor and the gap forming material are arranged at least in one direction perpendicular to the thickness direction thereof and piezoelectric precursors in form of sheets in a predetermined order.

The composite is formed by laminating a plurality of composite plate members, in a thickness direction thereof, in which the piezoelectric precursor and the gap forming material are arranged at least in one direction perpendicular to the thickness direction thereof and gap forming materials in form of sheets in a predetermined order.

The composite is formed by coating, in an overlapped manner, the piezoelectric precursor and the gap forming material both having fluidity so as to provide a predetermined pattern.

The composite is formed by applying the piezoelectric precursor in a mold formed of the gap forming material.

The above objects can be also achieved, in another aspect, by providing a method of manufacturing a piezoelectric element comprising the steps of:

preparing a piezoelectric precursor prepared by mixing a powder containing piezoelectric material with a binder material and a gap forming material;

filling a gap formed to the piezoelectric precursor with the forming material so as to form a composite of the piezoelectric precursor and the gap forming material; and removing the gap forming material from the composite.

Furthermore, there may be provided an ultrasonic probe formed from the piezoelectric element mentioned above though not mentioned in detail herein.

According to the present invention of the characters mentioned above, there is obtained a piezoelectric element composed of fine piezoelectric ceramics having uniform and high characteristic particularly having high aspect ratio or having a curved surface which was difficult to be manufactured by a conventional machine working.

Furthermore, there is obtained a piezoelectric element in which a number of fine piezoelectric ceramics are arranged or which has a complicated curved surface, which has been extremely hard to be manufactured by the conventional machine working, can be manufactured at once with high precision and high yielding with low manufacturing cost.

The nature and further characteristic features of the present invention may be made more clear from the following descriptions made with reference to the accompanying drawings.

BRIEF DESCRIPTION OF THE DRAWINGS

In the accompanying drawings:

FIG. 9 includes FIGS. 9A, 9B and 9C showing perspective views of the piezoelectric element on the way of the manufacturing process thereof according to the second embodiment;

FIG. 11 including

DESCRIPTION OF THE PREFERRED EMBODIMENTS

[First Embodiment]

Figure 1C:
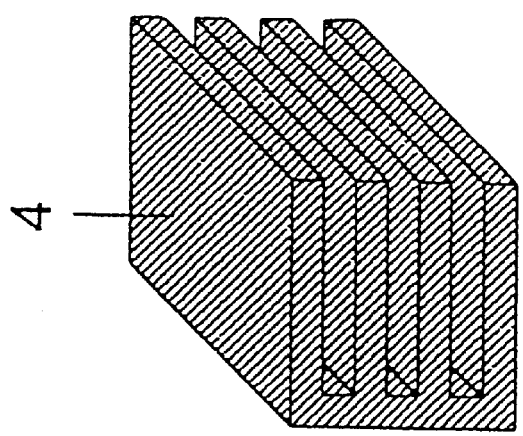
FIG. 1 represents a piezoelectric element according to one embodiment of the present invention and includes FIGS. 1A to 1C showing a manufacturing processes thereof.
Figure 1B:
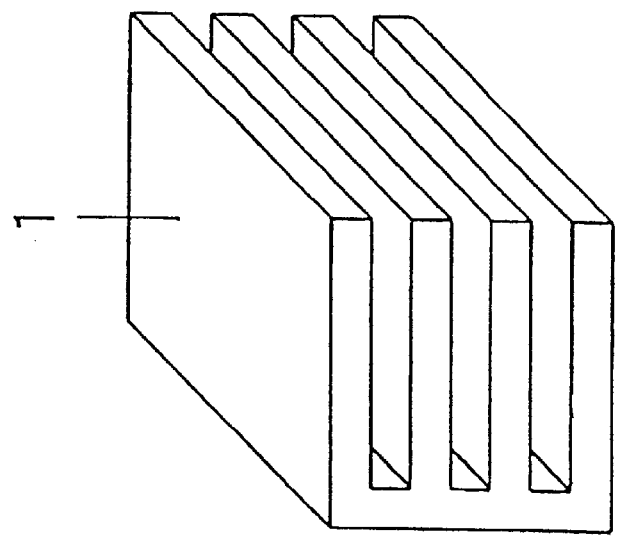
Figure 1A:
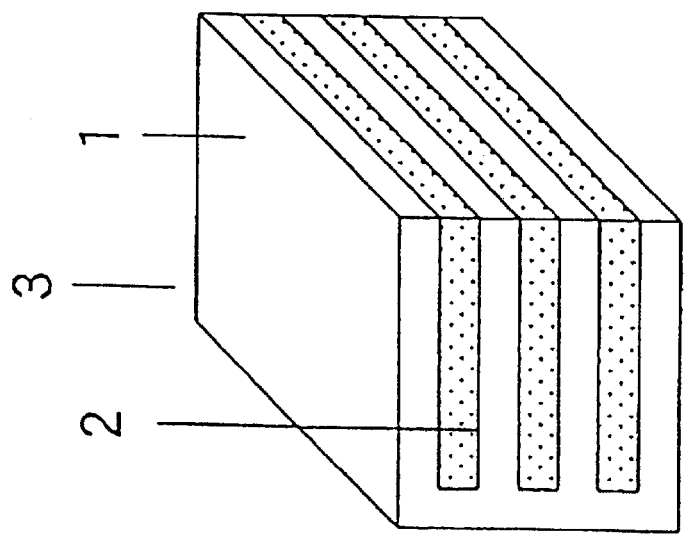
Figures 11A, 11B, 11C:
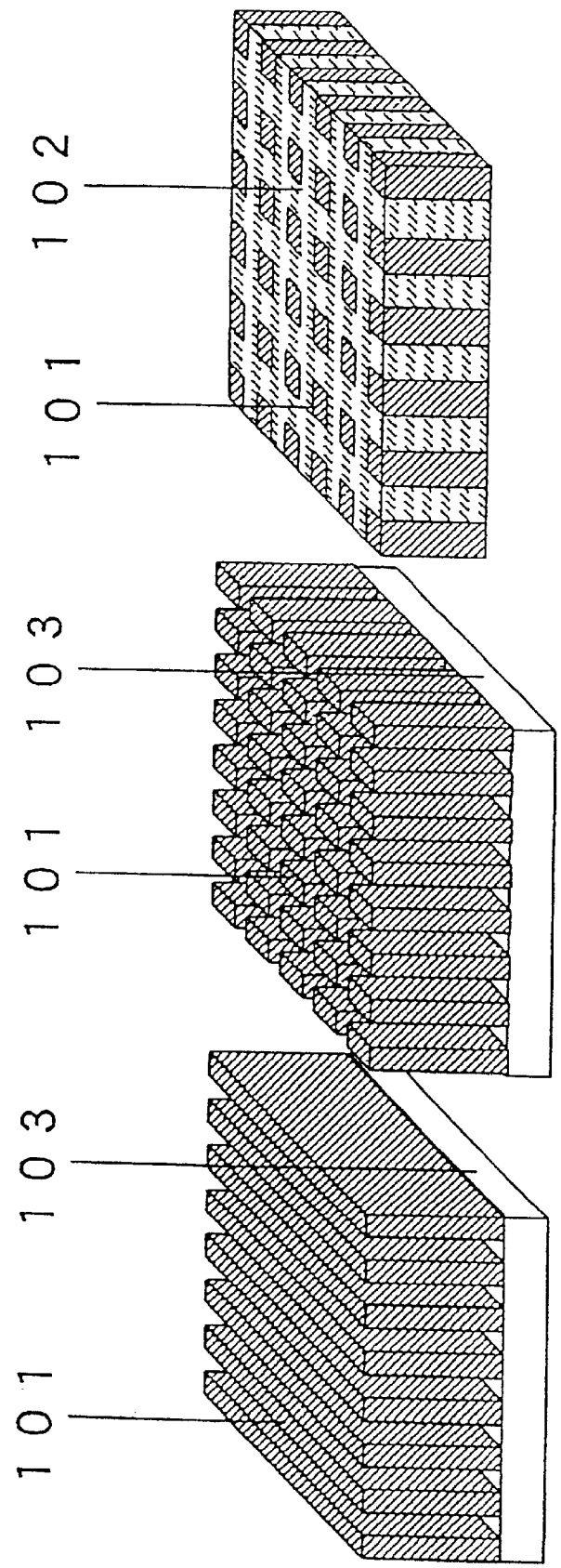
FIGS. 11A, 11B and 11C represent schematic structures of conventional piezoelectric elements.

FIGS. 1A to 1C are schematic views representing the manufacturing processes of a piezoelectric element according to a first embodiment of the present invention such as shown, and for example, the processes are for manufacturing a piezoelectric element utilized for a one-dimensional array type ultrasonic probe shown in FIG. 11A. The piezoelectric element shown in FIG. 11A has a structure in which plate (sheet)-shaped piezoelectric ceramics are arranged with predetermined gap (interval) in the thickness direction thereof.

FIG. 1A shows a process for forming a composite piezoelectric material body 3 (which may be called hereunder composite or composite material) by alternately laminating piezoelectric precursor 1 and gap forming material 2, FIG. 1B shows a process for removing the gap forming materials from the formed composite 3, and FIG. 1C shows a process for forming a piezoelectric element 4 by sintering the remaining piezoelectric precursor 1. These processes will be described hereunder further in detail.

Figure 2B:
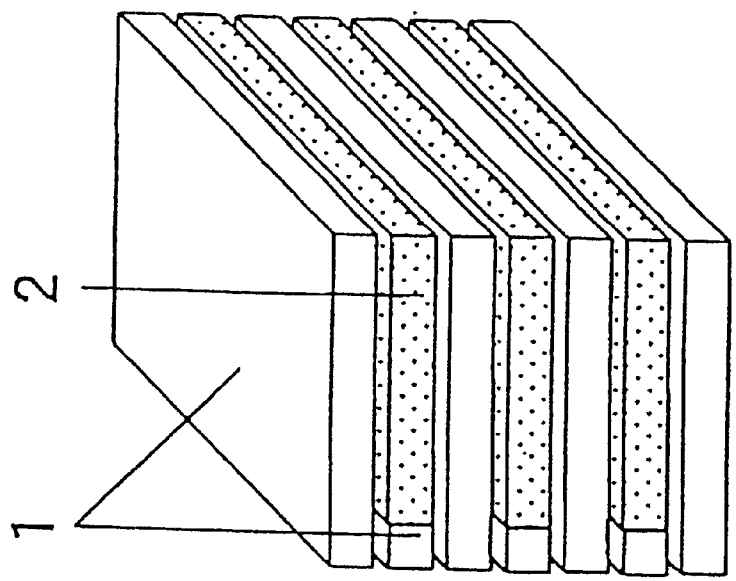
FIG. 2 includes FIGS. 2A and 2B showing perspective views of the piezoelectric element on the way of the manufacturing processes according to the first embodiment.
Figure 2A:
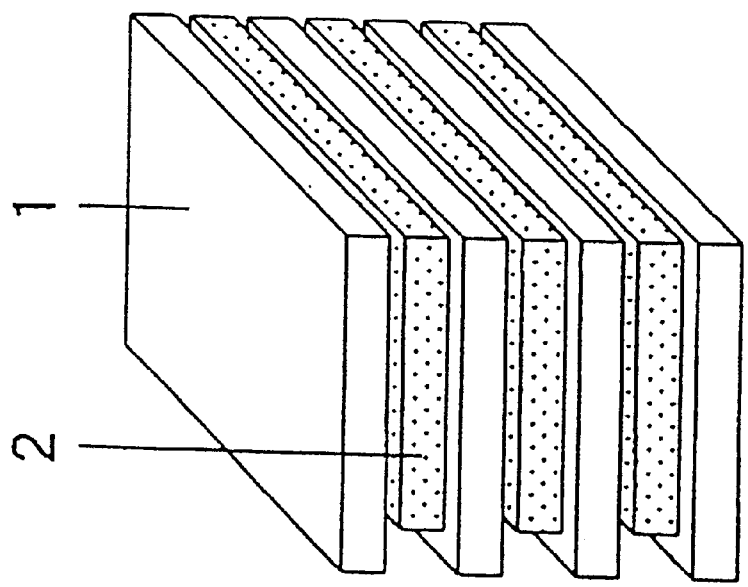

The piezoelectric precursors 1 and the gap forming material 2 are formed in form of sheets or layers and laminated in a predetermined order as shown in FIG. 2A to thereby form the composite 3 shown in FIG. 1A. In these processes, it is required that one end surface of the layers of the gap forming material 2 is formed to be shorter than that of the piezoelectric precursor sheet so that, when the piezoelectric precursor sheets of different layers are joined together, the entire one end surface of the composite 3 is formed of the piezoelectric precursor 1. Pressure and heat may be applied as occasion demands at the time of lamination of the piezoelectric precursor and the gap forming material 2.

The sheet of the piezoelectric precursor 1 may be formed by mixing piezoelectric ceramic powder and a binder (and if required, a plasticizer may be added), dissolving the mixture in a solvent and then forming it into sheet shape through a doctor blade method or like. The piezoelectric precursor 1 may be formed into a block which is then sliced into sheet shape.

The methods of forming the gap forming material 2 into sheet shape are different from each other in accordance with materials to be used. For example, in a case of using resin or like material for the gap forming material 2, the method utilized for the piezoelectric precursor 1 mentioned above will be also utilized. On the other hand, in a case of using metal material for the gap forming material 2, there will be selected a material from commercially sold metal plates having a desired thickness satisfying predetermined conditions, for example, such a requirement as not being reacted to the piezoelectric precursor 1. There may be also used, as the gap forming material 2, a material or substance which is not reacted to the piezoelectric ceramic or binder material, and materials or substances other than those mentioned above may be utilized.

In another forming method of the composite 3, the piezoelectric precursor 1 and the gap forming material 2 dissolved in a solvent into liquid form are coated and then dried repeatedly in a predetermined order. In this process, it will be desirable to use hydrophilic solvent and hydrophobic solvent into which the piezoelectric precursor 1 and the gap forming material 2 are dispersed or dissolved, respectively. According to this manner, the piezoelectric precursor 1 and the gap forming material 2 are not compatible during the coating thereof, whereby a composite 3 having a desired shape can be formed with high precision.

In each of the piezoelectric composite manufacturing methods mentioned above, it is necessary that, as shown in FIG. 1, at least one side end surface of the composite 3 is composed only of the piezoelectric precursor 1 so that the composite 3 maintains its integral structure and the piezoelectric element 4 can be formed with high precision after the removal of the gap forming material 2.

In the next step, the gap forming material 2 is removed from the composite 3 manufactured in the methods mentioned above. Further, in the case where the gap forming material 2 is formed of resin material or like, it may be possible to burn it in a high temperature atmosphere to thereby remove the gap forming material 2 in a gaseous state. In this step, it is necessary to control burning conditions so as not to generate crack or like to the piezoelectric precursor 1 by a pressure at a time of gasifying of the gap forming material 2.

Further, it will be necessary to make optimum the selection of the material for the gap forming material 2, the burning conditions thereof and the like so as to prevent residue such as carbon after the burning of the gap forming material 2 from remaining.

On the other hand, in the case where a metal or like material is used for the gap forming material 2, it is difficult to remove such metal gap forming material through the burning process, so that, before the sintering of the piezoelectric precursor 1, it is necessary to remove the gap forming material 2 through a withdrawing process, a chemical etching treatment or like procedure.

However, in a case where composite 3 is formed by laminating the piezoelectric precursor 1 and the gap forming material 2 in shapes of sheets, the composite will be formed with no generation of defects such as peeling or like by providing the sheet of the piezoelectric precursor 1 with a large compression deformation rate having a value capable of absorbing the thickness of the sheet of the gap forming material 2.

In the case where the gap forming material 2 has a large thickness, the compression rate at the time of lamination largely differs at a portion where the gap forming material sheet is present or a portion where it is not present. Because of this reason, the density of the piezoelectric precursor 1 in the composite 3 differs in portions, and hence, the compression rate differs at portions at the sintering time.

For the reason mentioned above, even if the composite 3 including the piezoelectric precursor 1 be formed with a desired shape, it will be deformed during the sintering process of the piezoelectric precursor 1, and therefore, it becomes difficult to manufacture the piezoelectric element 4 having a desired shape with high precision.

In such a case, as shown in FIG. 2B, it is desired to dispose the piezoelectric precursor sheets, each having the same thickness as that of the gap forming material 2, to portions of the gap forming material arranging layers at which the gap forming material 2 is not present, and after the arrangement of such piezoelectric precursor sheets, these layers are to be laminated. According to such manner, different from the case of FIG. 2A, it is possible to remove the difference in the compression rate of the piezoelectric ceramic in the composite 3 at the sintering time while maintaining a portion constituting a wide gap by laminating the thick gap forming material sheets 2, thus being advantageous.

Moreover, it is effective to employ the method represented by FIG. 3 as a method of forming the piezoelectric element 4 having a wide width with less strain at the sintering time. FIG. 3 is an illustration for forming the composite 3 by laminating, in the predetermined order, the composite sheet 5 composed of the piezoelectric precursor 1 and the gap forming material 2 and the sheet of the gap forming material 2.

Figure 3B:
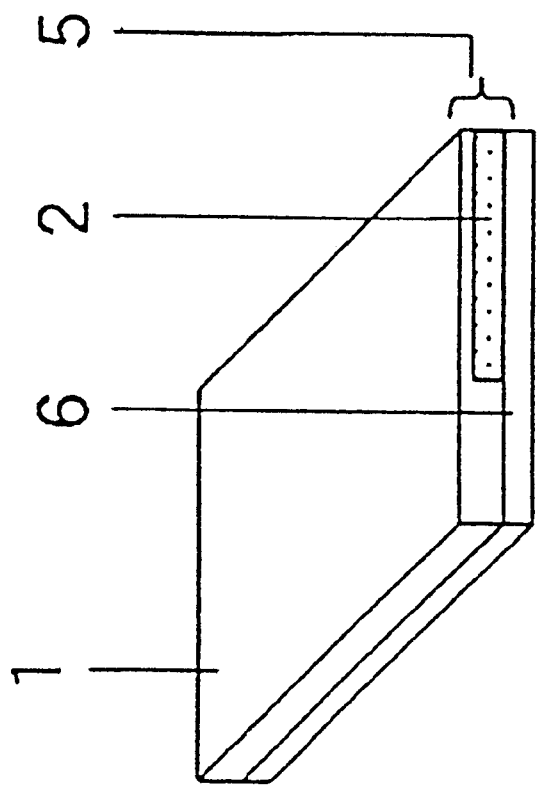
FIG. 3 includes FIGS. 3A and 3B showing perspective views of the piezoelectric element on the way of the manufacturing process thereof according to the first embodiment.
Figure 3A:
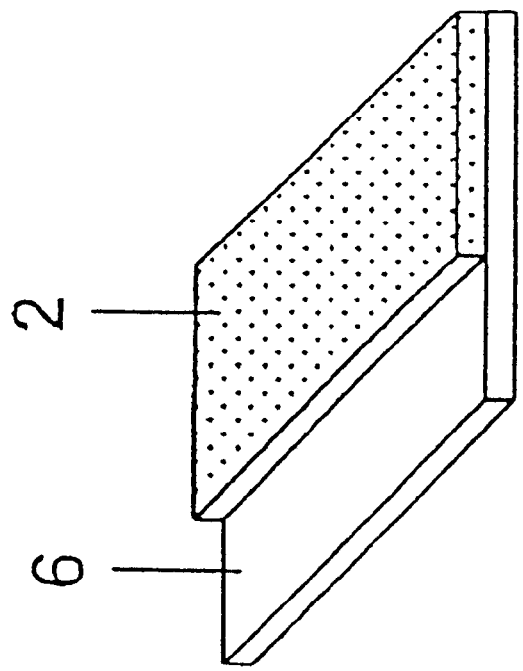

That is, with reference to FIGS. 3A and 3B, the composite sheet 5 formed by removing at least one end face of the gap forming material 2 formed on a carrier film 6 formed of such as PET (polyethylene terephtalate) or like (FIG. 3A) and, thereafter, forming the sheet of the piezoelectric precursor 1 on the gap forming material 2 by a doctor blade method (FIG. 3B).

According to this method, it is not necessary to carry out a fine machining working to the sintered piezoelectric ceramic, and the piezoelectric element, having the structure in which a plurality of plate-like piezoelectric ceramics are arranged as shown in FIG. 11A, can be easily manufactured with high precision.

Moreover, according to this method, there is no fear of causing cracks or crazings to the piezoelectric ceramic, so that the high and uniform piezoelectric characteristics can be realized. Furthermore, there is no restriction to the shape of the piezoelectric element 4 by the dimension of the working tool, such as width of the dicing blade at the time of the dicing working, and therefore, the piezoelectric element 4 having a fine structure effectively applicable for high frequencies can be manufactured and produced.

[Second Embodiment]

A second embodiment of the present invention will be described hereunder with reference to FIG. 4. In this embodiment, there will be explained a piezoelectric element and a method of manufacturing the same, the piezoelectric element being one for two-dimensional array-type ultrasonic probe such as shown in FIGS. 11B and 11C; that is, one like a piezoelectric composite material in which columnar piezoelectric ceramics are arranged.

Figure 4C:
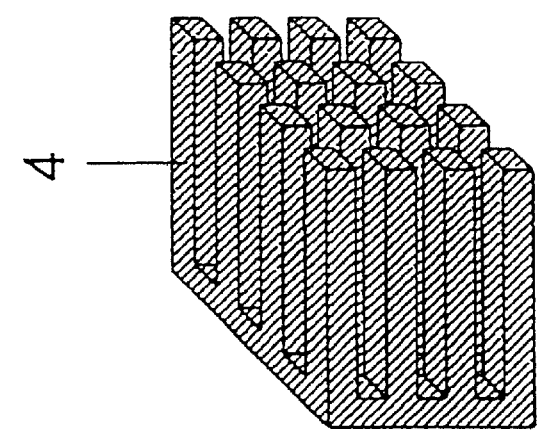
FIG. 4 includes FIGS. 4A, 4B and 4C showing perspective views of the piezoelectric element on the way of the manufacturing process thereof according to a second embodiment of the present invention.
Figure 4B:
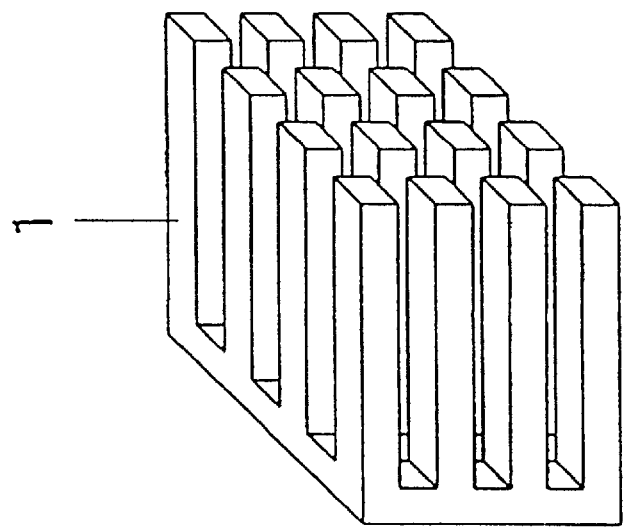
Figure 4A:
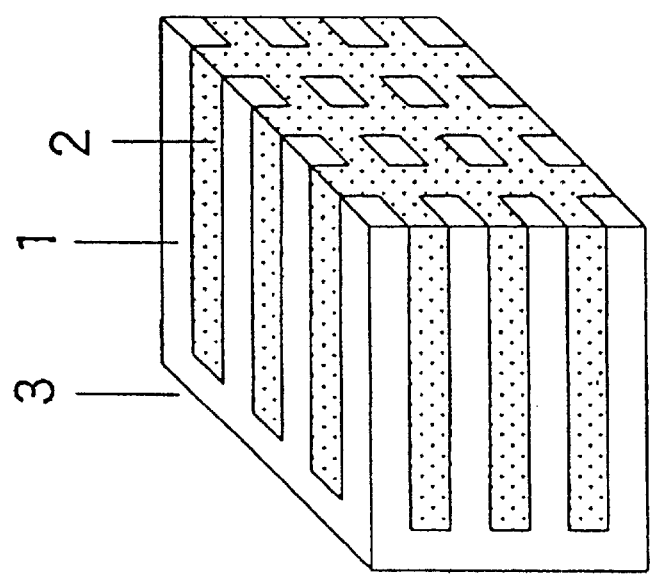

FIG. 4A shows the structure in which the piezoelectric precursor 1 are arranged in shape of columns with gaps into which the gap forming material 2 fills to thereby provide the piezoelectric composite 3. FIG. 4B shows the state that the gap forming material 2 is removed from the composite 3 of FIG. 4A, and FIG. 4C shows the steps of sintering the remaining piezoelectric precursor 1 for producing the piezoelectric element 4 utilized for, for example, the two-dimensional array-type ultrasonic probe and the composite piezoelectric material shown in FIGS. 11B and 11C. The details of these steps will be further mentioned hereunder.

The composite 3 shown in FIG. 4 is formed through the following steps, for example.

Figure 5B:
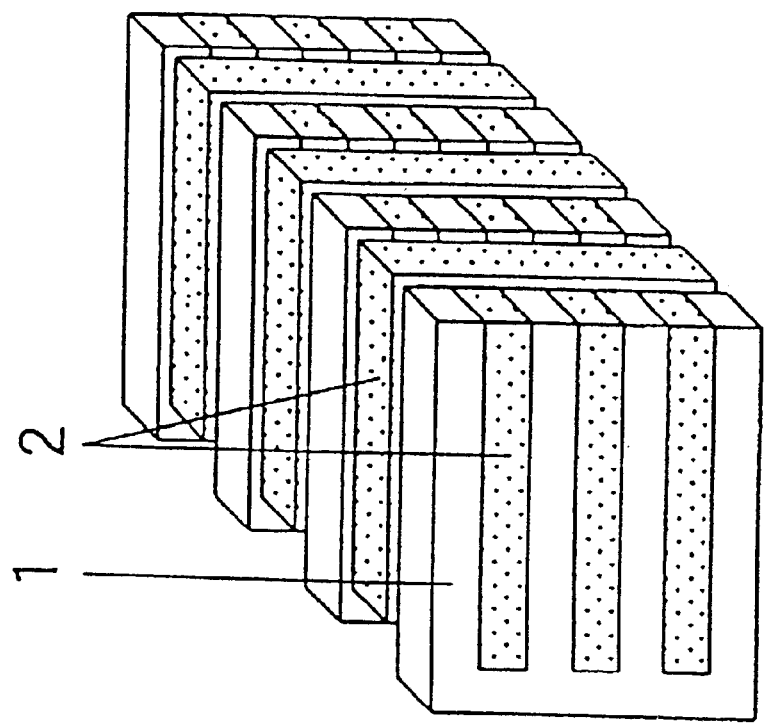
FIG. 5 includes FIGS. 5A and 5B showing perspective views of the piezoelectric element on the way of the manufacturing processes according to the second embodiment.
Figure 5A:
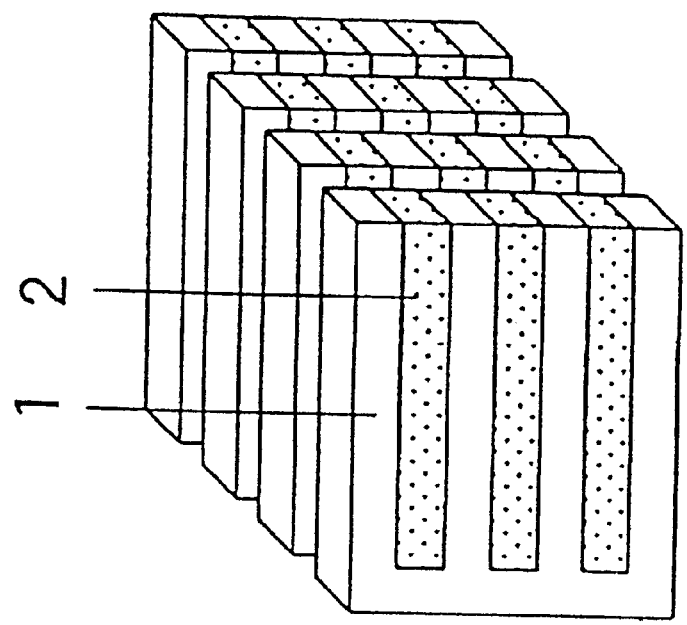

The composite 3 shown in FIG. 1 is sliced into a plurality of sheets of composite in a direction perpendicular to the laminated direction of the composite 3, i.e. in the depth direction on the drawing paper, each having a thin thickness such as shown in FIG. 5A in which the piezoelectric precursor and the gap forming material are arranged in one sheet in a predetermined pattern.

The thus formed composite sheets 5 and the sheets of the gap forming material 2 are laminated in the predetermined order, and as occasion demands, pressure and/or heat is applied thereto to produce the composite 3 shown in FIG. 4A.

Figure 6B:
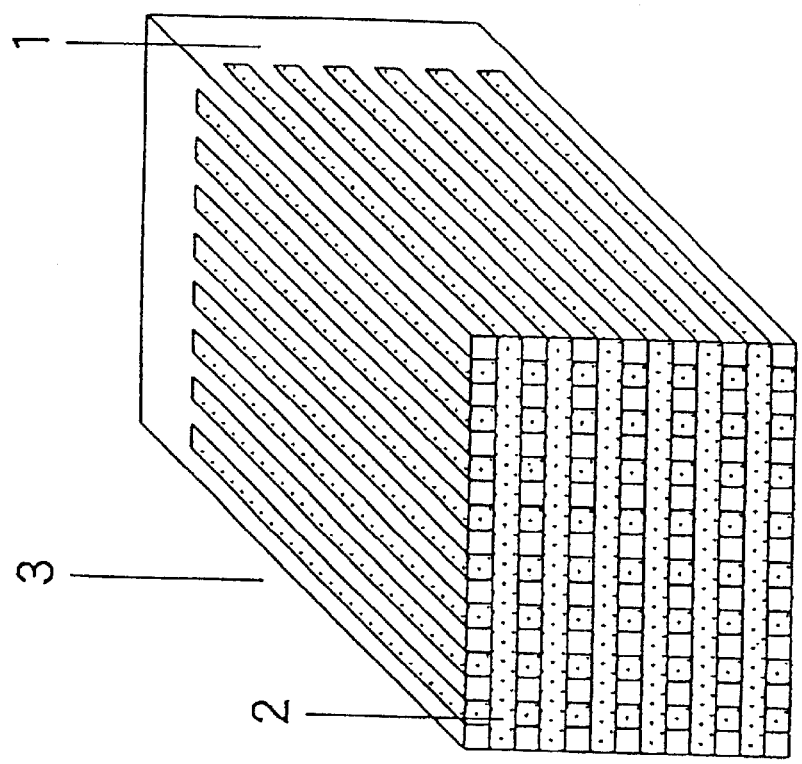
FIG. 6 includes FIGS. 6A and 6B showing perspective views of the piezoelectric element on the way of the manufacturing process thereof according to the second embodiment.
Figure 6A:
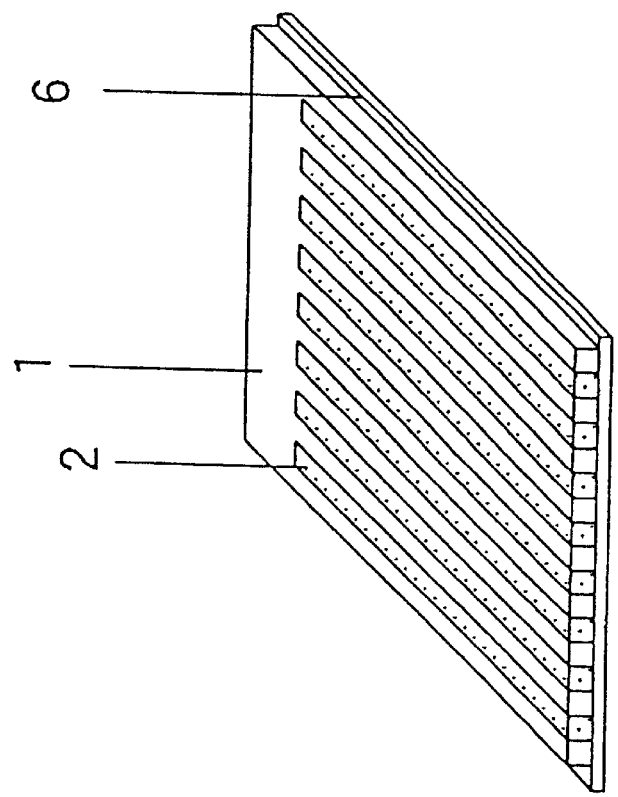

In another method of manufacturing a composite 3, a composite sheet formed so as to provide, as shown in FIG. 6A, a pattern in form of comb teeth of piezoelectric precursor 1 and the gap forming material 2 arranged alternately on the carrier film such as PET and a composite sheet in which one end face of the gap forming sheet is formed to the piezoelectric precursor are alternately laminated to thereby form a composite 3 as shown in FIG. 6B.

In a further manufacturing method of the composite 3, the composite 3 is formed, as like in the first embodiment, by dispersing or dissolving the piezoelectric precursor 1 and the gap forming material 2 into solvents in form of solutions, which are then applied in a predetermined pattern and then dried.

Figure 7:
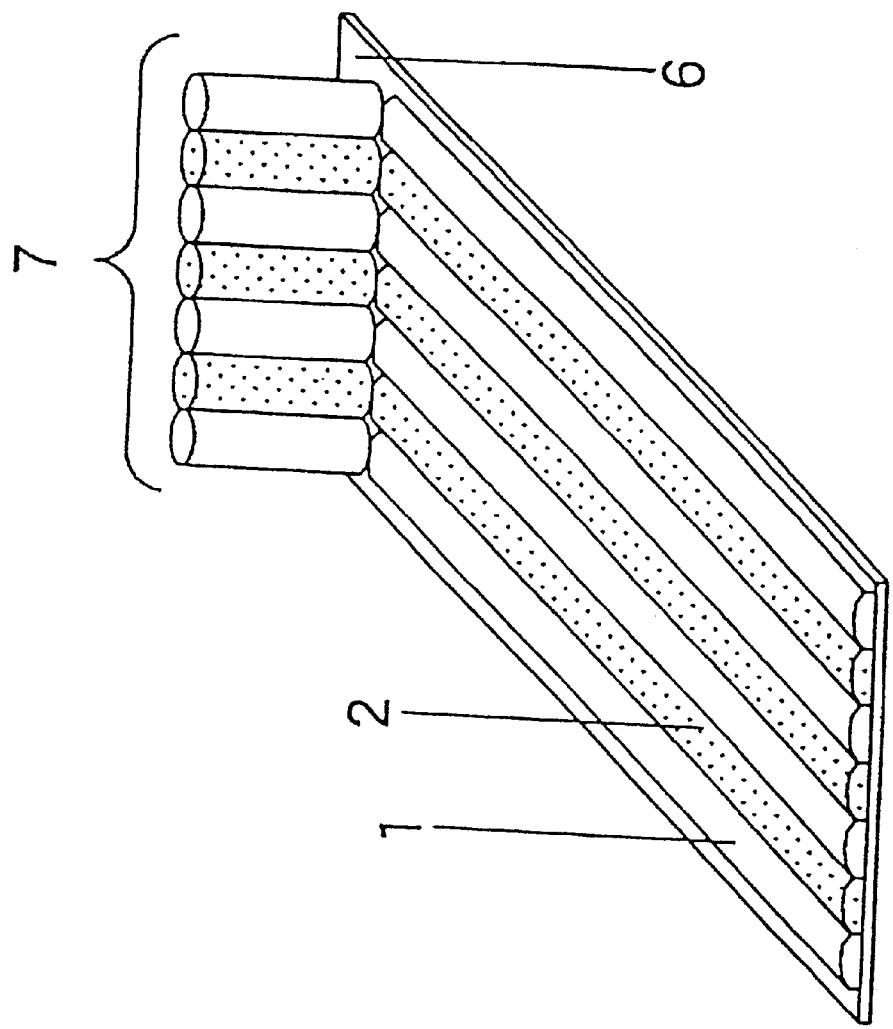
FIG. 7 is a perspective view showing piezoelectric element on the way of the manufacturing process thereof according to the second embodiment of the present invention.

In this method, the layer composed only of the gap forming material 2 can be entirely uniformly coated. However, with a layer including the piezoelectric precursor 1, a layer of the piezoelectric precursor 1 and the gap forming material 2 of a desired pattern can be formed by supplying the piezoelectric precursor 1 and the gap forming material 2 at a predetermined amount through a supply member 7, for example, fine tube, in accordance with the predetermined pattern such as shown in FIG. 7. In this process, it is desirable, as in the former method, to use solvents having different polarities, such as hydrophilic and hydrophobic solvents, in which the piezoelectric precursor 1 and the gap forming material 2 are dissolved.

Figure 8B:
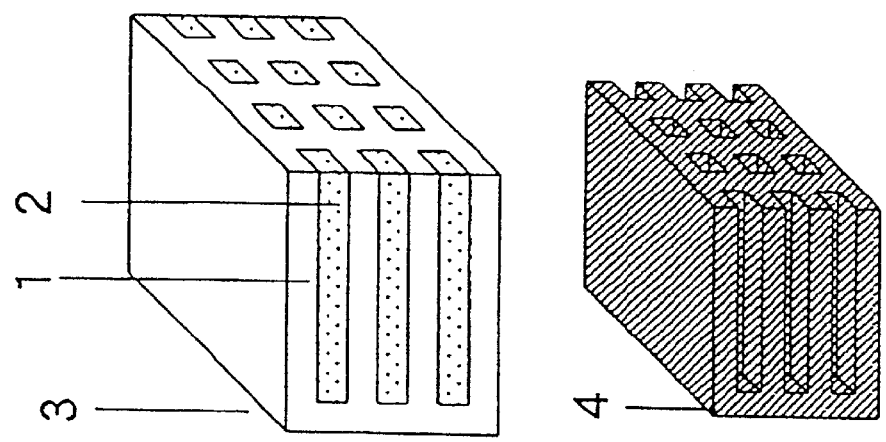
FIG. 8 includes FIGS. 8A and 8B showing perspective views of the piezoelectric element on the way of the manufacturing processes according to the second embodiment.
Figure 8A:
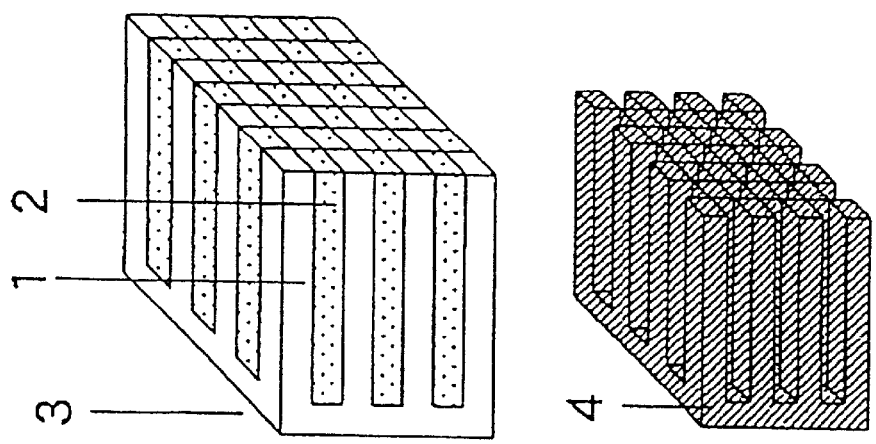

In the foregoing procedures, the composite 3 is formed by laminating the layer in which the piezoelectric precursor 1 and the gas forming material 2 are patterned and the layer of the gap forming material 2. However, piezoelectric elements 4 having various shapes, which are difficult to be formed by a usual machine working, can be produced by repeatedly laminating the layers in which the piezoelectric precursor 1 and the gap forming material 2 are patterned respectively as shown in FIG. 8A or by forming the composite 3 by laminating the layer in which the piezoelectric precursor 1 and the gap forming material 2 are patterned and the layer of the piezoelectric precursor 1.

In a still further method of manufacturing the composite 3, the piezoelectric precursor 1 fills in a mold formed of the gap forming material 2, which will be represented by FIG. 9.

FIG. 9 including FIGS. 9A, 9B and 9C, represents a method of manufacturing the piezoelectric material 3a having a structure in which the two-dimensional array-type ultrasonic probe and the columnar piezoelectric ceramics such as piezoelectric composite material are arranged. First, as shown in FIG. 9A, there is formed a mold of the gap forming material 2 having a pattern having a shape reverse to that of an aimed piezoelectric element 4. The mold of the gap forming material 2 will be manufactured by, for example, the following manner.

In order to manufacture the mold of the gap forming material 2, an original mold having a shape similar to the piezoelectric material (composite) 3a is first prepared. The dimension of the original mold will be determined in consideration of a coefficient of contraction (shrinkage factor) at the sintering time of the piezoelectric precursor 1. An original mold for forming the gap forming material 2 will be formed by carrying out an electric discharging working or dicing working to metal or ceramic. Further, since the original mold is a mold merely for forming the mold of the gap forming material 2, it is not necessary to form a lot of such molds even in the case of manufacturing a number of piezoelectric elements 4.

Next, the surrounding of the original mold, formed as shown in FIG. 9B, is covered by, for example, a tape or like means for forming a wall section to the mold, and then, the gap of the original mold covered by the wall section is filled up with the gap forming material 2. For this or other purpose, it is desired for the gap forming material 2 to have a fluidity so as to be entirely spread in the gap of the original mold. For the gap forming material utilized for this manufacturing method, it is preferred to use a resin or like material, which is capable of being dispersed or dissolved in the solvent or which has a good fluidity at not-hardened state.

When the gap forming material fills the original mold, since the piezoelectric precursor 1 fills the gap in a state separating from the original mold, it is desired to provide a surface layer on the surface of the original mold for the easy peeling-off of the gap forming material 2 therefrom. The surface layer formed of fluorine material preferably of Teflon.

In order to smoothly peel off the gap forming material 2 filling the original mold, it is desirable to peel off it from the end surface portion thereof so as not to cut or damage the gap forming material 2. For this purpose, it is preferred to make thin the thickness of the bottom portion of the mold formed with the gap forming material 2 within a range capable of being kept as a structural member. In the structure of the thickened bottom thickness, it is hard for the bottom surface portion to be deformed and a stress will be easily concentrated to a root portion of the column of the mold formed with the gap forming material. In such case, the columnar portion may be broken at its root portion. As mentioned above, the piezoelectric precursor 1 fills the mold of the gap forming material 2 formed from the original mold in the manner described hereinbefore, and through this manner, the composite 3 is formed.

According to the method mentioned above, it is not necessary to perform a fine machine working to the sintered piezoelectric ceramic, and it becomes possible to manufacture the piezoelectric element 4 in which a number of piezoelectric ceramics, such as shown in FIG. 11, each having fine structure are arranged with high precision and high yielding. Furthermore, according to this method, the piezoelectric ceramic is substantially free from cracks or like defects, so that the piezoelectric performance or characteristics can be made further high and uniform.

Furthermore, in the dicing method using dicing saw, the shape of the piezoelectric element 4 is influenced by the width of the working tool. On the other hand, according to the method of the present invention, such influence is not caused, so that the piezoelectric element 4 having the fine structure can be manufactured, which is capable of being applicable for high frequencies, for example.

[Third Embodiment]

A third embodiment of the present invention will be described hereunder with reference to FIG. 10, including FIGS. 10A, 10B and 10C. In this embodiment, at least one layer of the piezoelectric precursor 1 and at least one layer of gap forming material 2 are laminated as shown in FIG. 10A, and the lamination layer is then rolled up as a roll of the composite 3 as shown in FIG. 10B. The gap forming material 2 is thereafter removed from such composite material roll 3 and the thus formed piezoelectric precursor 1 is sintered to thereby provide the piezoelectric element 4 such as shown in FIG. 10C.

Figure 10C:
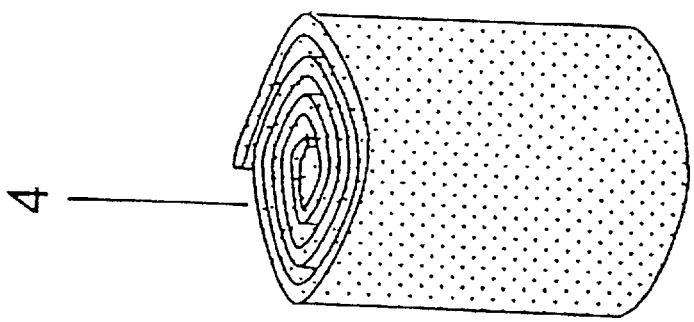
FIG. 10 includes FIGS. 10A, 10B and 10C showing perspective view of the piezoelectric element on the way of the manufacturing process thereof according to a third embodiment of the present invention.
Figure 10B:
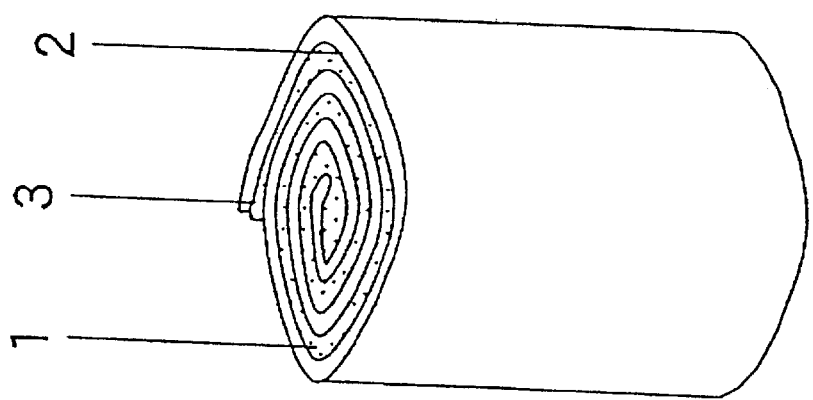
Figure 10A:
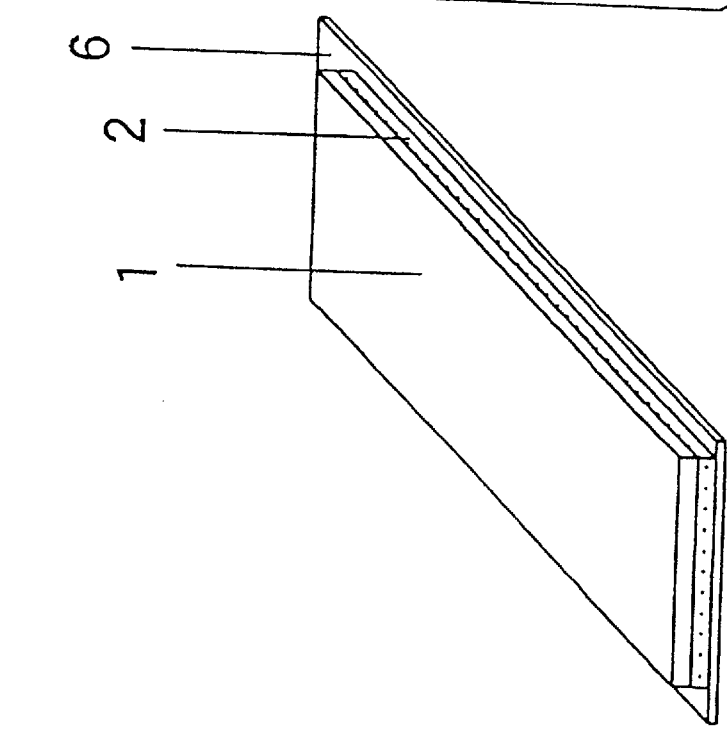

According to this embodiment, it becomes possible to manufacture the piezoelectric element 4 shown in FIG. 10, which was extremely difficult in the conventional machine working to be manufactured. With the piezoelectric element 4 shown in FIG. 10C, a large displacement can be obtained only by applying a small voltage through the provision of an electrode in its thickness direction.

In the embodiment of FIG. 10, although the composite material 3 formed by laminating the piezoelectric precursor 1 and the gap forming material 2 and rolling up them, it may be possible to manufacture composite materials by folding the composite 3 of the lamination of the piezoelectric precursor 1 and the gap forming material 2 into a bellows form, into a spiral form or like form, to thereby provide piezoelectric elements 4 having various forms or shapes.

As mentioned hereinbefore, according to the present invention, the piezoelectric elements in which a number of fine piezoelectric ceramics are arranged or which have complicated curved surfaces, which have been extremely hard to be manufactured by the conventional machine working, can be manufactured at once with high precision and high yielding with low manufacturing cost.

It is further to be noted that the present invention is not limited to the described embodiment and many other changes and modifications may be made without departing from the scopes of the appended claims.

What is claimed is:

1. A method of manufacturing a piezoelectric element comprising the steps of:

preparing a piezoelectric precursor prepared by mixing a powder containing piezoelectric material with a binder material and a gap forming material;

filling a gap formed to the piezoelectric precursor with said forming material so as to form a composite of the piezoelectric precursor and the gap forming material; and removing said gap forming material from the composite.

2. The method of manufacturing a piezoelectric element according to claim 1, wherein the gap formed by removing the gap forming material is filled up with a filler.

3. The method of manufacturing a piezoelectric element according to claim 2, wherein the composite is formed by laminating the precursor and the gap forming material in a predetermined order.

4. The method of manufacturing a piezoelectric element according to claim 1, wherein the composite is formed as a roll.

5. The method of manufacturing a piezoelectric element according to claim 1, wherein the composite is formed by laminating a plurality of composite members in shape of sheets, in a thickness direction thereof, in which the piezoelectric precursor and the gap forming material are arranged at least in one direction perpendicular to the thickness direction thereof.

6. The method of manufacturing a piezoelectric element according to claim 1, wherein the composite is formed by laminating a plurality of composite members in shape of sheets, in a thickness direction thereof, in which the piezoelectric precursor and the gap forming material are arranged at least in one direction perpendicular to the thickness direction thereof and piezoelectric precursors in form of sheets in a predetermined order.

7. The method of manufacturing a piezoelectric element according to claim 1, wherein the composite is formed by laminating a plurality of composite members in shape of sheets, in a thickness direction thereof, in which the piezoelectric precursor and the gap forming material are arranged at least in one direction perpendicular to the thickness direction thereof and gap forming materials in form of sheets in a predetermined order.

8. The method of manufacturing a piezoelectric element according to claim 1, wherein the composite is formed by coating, in an overlapped manner, the piezoelectric precursor and the gap forming material both having fluidity so as to provide a predetermined pattern.

9. The method of manufacturing a piezoelectric element according to claim 1, wherein the composite is formed by applying the piezoelectric precursor in a mold formed of the gap forming material.

* * * * *